US010043741B2

(12) United States Patent
Tailliet et al.

(10) Patent No.: US 10,043,741 B2
(45) Date of Patent: Aug. 7, 2018

(54) LOW-DISPERSION COMPONENT IN AN ELECTRONIC CHIP

(71) Applicant: STMicroelectronics (Rousset) SAS, Rousset (FR)

(72) Inventors: François Tailliet, Fuveau (FR); Guilhem Bouton, Peynier (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/380,894

(22) Filed: Dec. 15, 2016

(65) Prior Publication Data

US 2017/0373001 A1    Dec. 28, 2017

(30) Foreign Application Priority Data

Jun. 28, 2016    (FR) ..................................... 16 56020

(51) Int. Cl.
| *G01R 31/26* | (2014.01) |
| *H01L 23/522* | (2006.01) |
| *H01L 21/768* | (2006.01) |
| *H01L 23/528* | (2006.01) |
| *H01L 27/02* | (2006.01) |
| *H01L 49/02* | (2006.01) |
| *H01L 21/66* | (2006.01) |

(52) U.S. Cl.
CPC .... *H01L 23/5223* (2013.01); *H01L 21/76895* (2013.01); *H01L 22/22* (2013.01); *H01L 22/32* (2013.01); *H01L 23/528* (2013.01); *H01L 27/0207* (2013.01); *H01L 28/60* (2013.01)

(58) Field of Classification Search
None
See application file for complete search history.

(56) References Cited

U.S. PATENT DOCUMENTS

| 5,779,922 | A | | 7/1998 | Boon et al. | |
| 6,133,834 | A | * | 10/2000 | Eberth | G06K 19/07749 29/593 |
| 6,962,875 | B1 | | 11/2005 | Stamper | |
| 7,363,099 | B2 | * | 4/2008 | Smith | G06F 17/5068 438/14 |
| 7,383,521 | B2 | * | 6/2008 | Smith | G06F 17/5068 716/114 |
| 8,627,259 | B2 | * | 1/2014 | Huang | H01G 4/33 257/303 |
| 9,431,220 | B1 | * | 8/2016 | Ohashi | H01J 37/32449 |
| 9,431,338 | B2 | * | 8/2016 | Priel | H01L 23/5223 |
| 9,484,249 | B1 | * | 11/2016 | Ohashi | H01L 22/12 |
| 2002/0083401 | A1 | * | 6/2002 | Breiner | G03F 7/70625 716/56 |
| 2003/0229410 | A1 | * | 12/2003 | Smith | G06F 17/5068 700/109 |
| 2003/0229479 | A1 | * | 12/2003 | Smith | G06F 17/5068 703/14 |

(Continued)

*Primary Examiner* — David E Graybill
(74) *Attorney, Agent, or Firm* — Seed IP Law Group LLP

(57) ABSTRACT

A method of manufacturing electronic chips containing low-dispersion components, including the steps of: mapping the average dispersion of said components according to their position in test semiconductor wafers; associating, with each component of each chip, auxiliary correction elements; activating by masking the connection of the correction elements to each component according to the initial mapping.

16 Claims, 3 Drawing Sheets

(56) References Cited

U.S. PATENT DOCUMENTS

| | | | |
|---|---|---|---|
| 2004/0201077 A1* | 10/2004 | Momohara | G01R 31/31721 257/499 |
| 2005/0132306 A1* | 6/2005 | Smith | G06F 17/5068 716/114 |
| 2005/0139885 A1* | 6/2005 | Liu | H01L 23/5223 257/296 |
| 2006/0234464 A1* | 10/2006 | Giraudin | H01L 21/76838 438/386 |
| 2007/0267673 A1* | 11/2007 | Kim | H01L 23/5223 257/303 |
| 2008/0304205 A1* | 12/2008 | Bang | H01G 4/06 361/328 |
| 2009/0032898 A1* | 2/2009 | Becker | G06F 17/5068 257/499 |
| 2009/0283860 A1 | 11/2009 | Le Neel et al. | |
| 2010/0237468 A1* | 9/2010 | Daley | H01L 23/5223 257/602 |
| 2013/0083586 A1* | 4/2013 | Petitprez | H01L 23/544 365/102 |
| 2014/0291731 A1* | 10/2014 | Becker | H01L 27/11807 257/206 |
| 2014/0310671 A1* | 10/2014 | Beer | G06F 17/5077 716/127 |

* cited by examiner

LOW-DISPERSION COMPONENT IN AN ELECTRONIC CHIP

This application claims the priority benefit of French patent application number 16/56020, filed on Jun. 28, 2016, the content of which is hereby incorporated by reference in its entirety to the maximum extent allowable by law.

BACKGROUND

Technical Field

The present disclosure relates to the manufacturing of electronic components such as integrated circuits and, more particularly, the present disclosure aims at forming within a semiconductor wafer components having a low dispersion with respect to one another.

Description of the Related Art

Integrated electronic circuits are generally manufactured from semiconductor wafers having a large number of identical electronic chips formed therein, said chips being subsequently separated from one another, generally by sawing.

The manufacturing of electronic chips comprises a large number of masking steps, specific operations being carried out according to the patterns of each mask, for example, dopant implantations, layer etchings, and electric connections in connection layers.

Conventionally, it can be observed that the electronic chips of a wafer contain elementary components such as capacitors, transistors, and memory cells, which exhibit certain dispersions of characteristics resulting from the manufacturing. In particular, a given component will not always have the same value from one semiconductor wafer to another, nor from one chip to another of a same semiconductor wafer.

In certain cases, such dispersions are highly critical, for example, when tuning capacitors are desired to be manufactured.

To overcome such dispersions, many solutions have been used in prior art, such as:
- imposing extremely strict constraints to the manufacturing method: this is expensive and the obtained dispersion limit is generally only in the order of ±7% within a wafer;
- sorting the obtained chips and rejecting bad chips: this may cause an efficiency loss greater than 10% if all chips for which there is a dispersion greater than ±5% are rejected; and/or
- performing laser adjustments at the end of the manufacturing: this is of course an expensive and lengthy technique.

Thus, methods enabling to decrease the manufacturing dispersion of electronic circuit chips to increase the manufacturing efficiency and avoid additional steps (sorting, laser adjustment . . . ).

BRIEF SUMMARY

Thus, an embodiment provides a method of manufacturing electronic chips containing low-dispersion components, comprising the steps of:
- mapping the average dispersion of said components according to their position in test semiconductor wafers;
- associating, with each component of each chip, auxiliary correction elements;
- activating by masking the connection of the correction elements to each component according to the initial mapping.

According to an embodiment, the components are capacitors and the correction elements are capacitors sharing an electrode with the main capacitor.

According to an embodiment, the capacitors are formed between two doped polysilicon layers and are provided with a dielectric formed of a succession of silicon oxide, nitride, and oxide layers.

According to an embodiment, the method provides step-and-repeat masking steps, one of the reticles being intended to ensure or not the connections of the auxiliary components, and wherein said reticle is shifted by a variable step in addition to the normal step-and-repeat step.

An embodiment provides a semiconductor wafer containing electronic chips, each chip comprising at least one component of a first type, this component being associated with auxiliary correction components connected or not according to the position of the chip in the wafer.

According to an embodiment, the components of the first type are capacitors and the auxiliary components are auxiliary capacitors sharing an electrode with the main capacitor and having surface areas much smaller than that of the main component, the auxiliary capacitors being connected or not according to the position of the chip in the wafer.

According to an embodiment, the capacitors are of ONO type.

An embodiment provides an integrated circuit chip obtained by sawing of a wafer such as hereabove.

The foregoing and other features and advantages will be discussed in detail in the following non-limiting description of dedicated embodiments in connection with the accompanying drawings.

DETAILED DESCRIPTION

Figure 1:
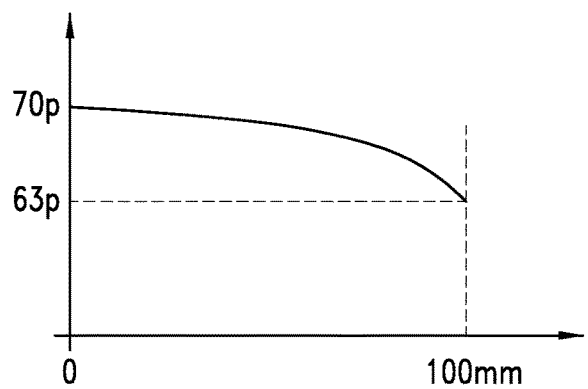
FIG. 1 shows the value of tuning capacitors arranged in various chips of a wafer according to the distance of these chips to the center of the wafer.

The same elements have been designated with the same reference numerals in the various drawings and, further, the various drawings are not to scale. For clarity, only those steps and elements which are useful to the understanding of the described embodiments have been shown and are detailed.

In the present description, to ease the understanding, only the specific case where tuning capacitors having as a dielectric a silicon oxide-nitride-oxide three-layer and having their opposite electrodes made of heavily-doped polysilicon will first be considered. Such capacitors will here be called ONO capacitors and may for example be used as tuning capacitors of a RF circuit. However, it should be noted that this is not the only application of the methods described herein.

The inventors have studied the dispersion of capacitances of ONO capacitors conventionally manufactured in a semiconductor wafer.

FIG. 1 shows, in ordinates, values of capacitance C and, in abscissas, distance r to the center of the semiconductor wafer of each chip having at least one ONO capacitor manufactured therein. It can be observed that if, for example, the capacitance value is 70 pF at the center of the chip, it decreases to a value of approximately 63 pF at the chip periphery. This example is given in the case of a wafer having a 200-mm diameter (8 inches).

Figure 2:
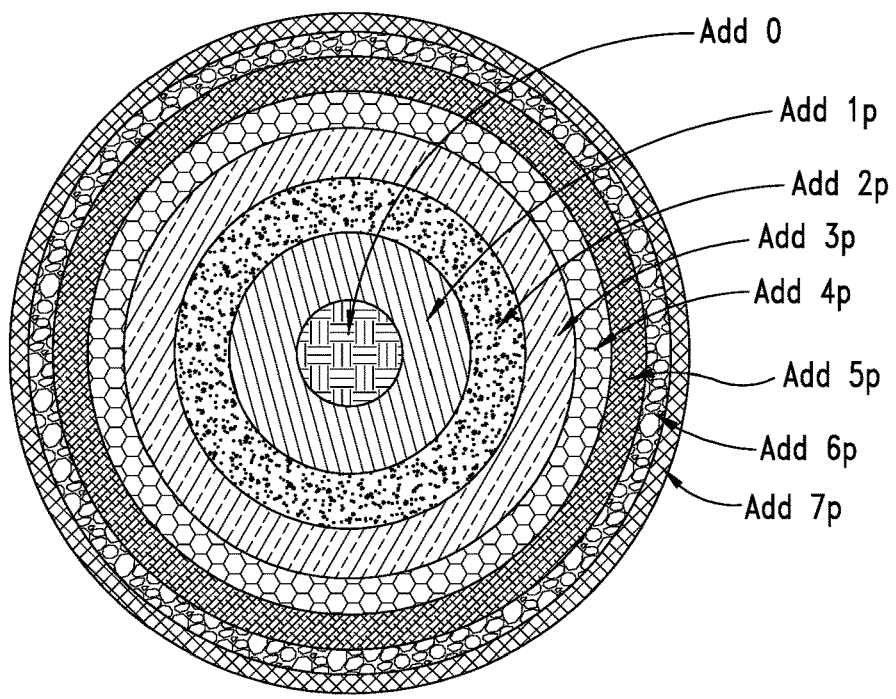
FIG. 2 illustrates a strategy of capacitance adjustment on a wafer.

FIG. 2 shows successive concentric areas of a semiconductor wafer. It should be noted that, if it is desired for all ONO capacitors to have the same 70-pF value at the center and at the periphery of the wafer, it is desirable, in the context of the example of FIG. 1, to keep the capacitors as such at the center (Add 0), to add 1 pF (Add 1p) to the capacitors located in the first ring, 2 pF (Add 2p) to the capacitors located in the next ring, 3 pF (Add 3p) to the capacitors located in the next ring, 4 pF (Add 4p) to the capacitors located in the next ring, 5 pF (Add 5p) to the capacitors located in the next ring, 6 pF (Add 6p) to the capacitors located in the next ring, and 7 pF (Add 7p) to the capacitors located in the last ring. Of course, such a division into seven areas is given as an example only. A finer division (more areas) or a rougher division (less areas) may be selected.

Figure 3:
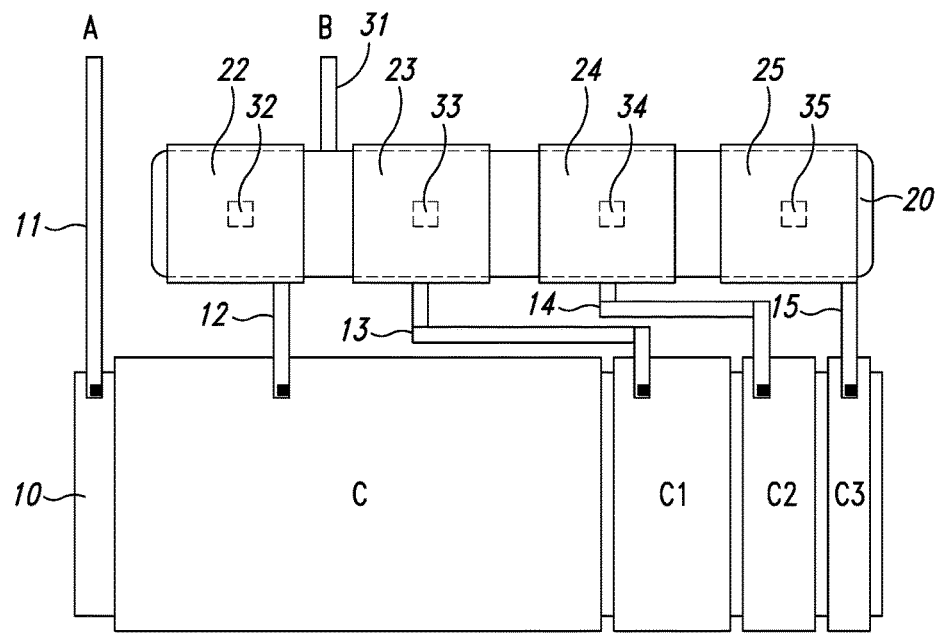
FIG. 3 shows a first embodiment of a dispersion-compensated capacitor structure.

As illustrated in FIG. 3, it is here provided to form each capacitor as having a single lower plate 10 and a plurality of upper plates C, C1, C2, C3. The lower and upper plates are for example made of doped polysilicon. Upper plate C has a surface area capable of providing, at the center of a wafer, a main capacitor C of desired capacitance, 70 pF in the example given herein. In this example, upper plates C1, C2, C3 correspond to auxiliary capacitors respectively having capacitances of 4, 2, and 1 pF.

A first connection metallization 11 extends between a contact, such as a conductive via in contact with lower plate 10, and a first node A of the capacitor. Connection metallizations 12, 13, 14, and 15 extend between conductive contacts on each of upper plates C, C1, C2, and C3 and pads 22, 23, 24, 25. Pads 22, 23, 24, 25 extend above a metallization 20 from which they are separated by an insulating layer, not shown. Metallization 20 is connected by a metallization connection 31 to a second node B of the capacitor.

According to whether contact pads 23, 24, 25 are placed or not in contact with metallization 20, one may add to capacitor C capacitors in parallel C1 and/or C2 and/or C3 to be able to add values in the range from 1 to 7 pF to the basic capacitor. This is done by masking. For all pads 23-25, a conductive via 33-35 is formed or not between each of the pads and metallization 20. All pads 22 are connected to metallization 20 by a conductive via 32. It should be noted that the fact that the upper plates of auxiliary capacitors C1, C2, C3 are always present, be they connected or not, enables to streamline the manufacturing, all the wafer capacitors being made in the same way. Only the mask corresponding to a step of definition of vias 33-35 is modified according to the wafer area where the capacitor is located.

The above example is particularly simple and corresponds to the case where a single mask is used to manufacture all the chips of a wafer. It should be noted that various embodiments may be selected to place in parallel at least one of capacitors C1, C2, C3 with capacitor C. Connections 13-15 for example may or may not be interrupted.

Actually, step-and-repeat methods are generally used to manufacture integrated circuits: masks or reticles are manufactured and the reticles are displaced from one area to the other of the wafer.

Figure 4:
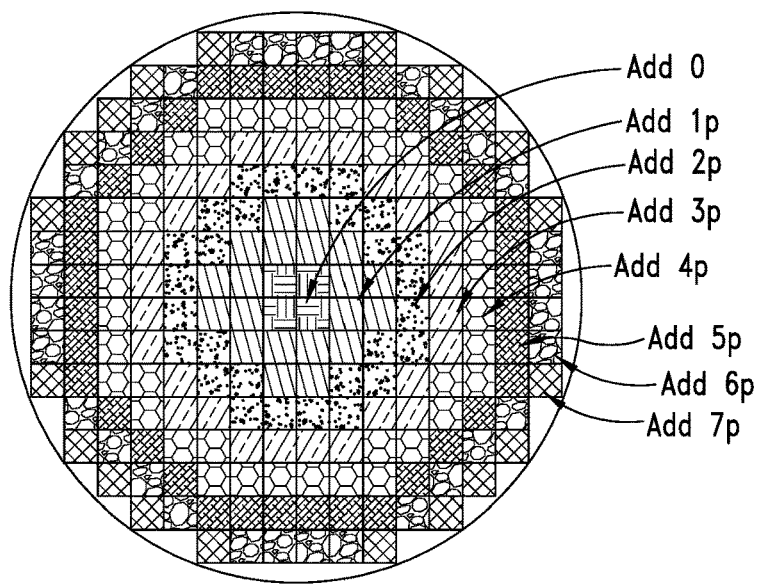
FIG. 4 shows the shape of patterns obtained by a step-and-repeat method on a silicon wafer.

Each of the squares illustrated in FIG. 4 corresponds to the dimension of the reticle which will be repeated. Each square generally comprises a plurality of chips, for example, 1,000. The squares corresponding to each of the ring-shaped areas of FIG. 2 will contain capacitors of same values, and this value will be shifted from the center to the periphery of the wafer according to areas (Add 0), (Add 1p), (Add 2p), (Add 3p), (Add 4p), (Add 5p), (Add 6p), and (Add 7p) described in relation with FIG. 2.

A problem is that, when a step-and-repeat method is used, all reticle patterns are identical given that the reticle cannot be modified from one repetition to the next one.

Figure 5:
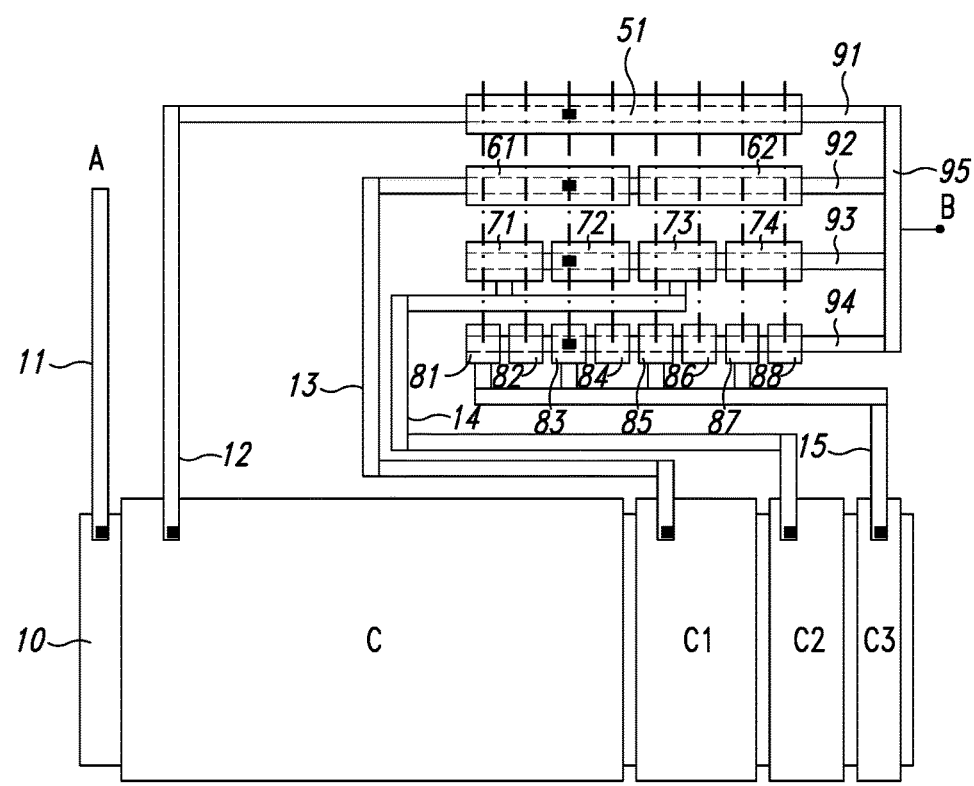
FIG. 5 shows a second embodiment of a dispersion-compensated capacitor structure.

FIG. 5 illustrates an embodiment of the auxiliary capacitor correction connections. In the example of FIG. 5, four capacitors C, C1, C2, C3 and rear conductive plate 10 connected, as previously, by a metallization 11 to a node A (first electrode of the capacitor) have been shown. Metallizations 12, 13, 14, and 15 connected to each of the upper conductive layers of capacitors C, C1, C2, C3 are connected, as shown as an example, to a sequence of pads arranged parallel to one another. Connection 12 is connected to a single elongated pad 51. Connection 13 is connected to one of two elongated pads 61 and 62 extending along half the length of pad 51. Connection 14 is connected to two alternated pads among four pads 71, 72, 73, 74 having half the length of pads 61 and 62 and extending parallel thereto. The last connection 15 to capacitor C3 is connected to four alternated pads among eight pads 81-88. The pads rest on an insulating layer (not shown) that is on elongated metallization strips 91, 92, 93, 94 interconnected by a metallization 95 corresponding to terminal B of the capacitor.

An example of locations to which the pads are connected or not by conductive vias through the insulating layer to the metallization formed under them has been shown by a line of vertically-aligned black squares. Pad 51 is always connected by a contact (a black square) to the underlying metallization, that is, terminal B always takes into account capacitor C. In the shown example, pad 61, connected to metallization 13, is also connected to underlying metallization 92, that is, capacitor C1 is arranged in parallel with capacitor C. Pad 72 is arranged at a location such that it is not connected to metallization 14. This means that capacitor C2 is not arranged in parallel on capacitors C and C1. However, pad 83 is connected to the underlying metallization, the pad being connected to metallization 15. Thus, capacitor C3 is arranged in parallel with capacitor C. Accordingly, in this example, only capacitors C, C1, and C3 are connected in parallel, that is, in the context of the given numerical example, 4+1 pF are added to capacitance C (the values of capacitors C1 and C3).

It should be understood that, according to the horizontal shift of the row of vias, all values between 0 and 7 pF may be added to the capacitance of capacitor C. A specific mask determines the positions of the rows of vias and it is possible, in a step-and-repeat process, to slightly shift the step-and-repeat distance between two successive repetitions. This enables to shift the rows of vias. The shifting step may be 100 nm only in current advanced technologies.

An example where the shifting of the rows of vias is horizontal, it should however be understood that other configurations using vertical shifts or combinations of horizontal and vertical shifts may be selected. Thus, it is possible to obtain ONO capacitors which all have a same value, at the center as well as at the periphery of a semiconductor wafer. This is obtained without adding any additional manufacturing step, but only, in the example given hereabove, by slightly shifting the position of a mask during a step-and-repeat process.

As indicated at the beginning of the present disclosure, a specific example where ONO capacitors, for example used as tuning capacitors is a radio frequency circuit, are formed, has been given. The inventors have observed that the type of constant dispersion between the center and the periphery of a semiconductor wafer described in relation with FIG. 1 appears for other components. Such a dispersion may exist for MOS transistors, for memory cells, for capacitors other than ONO capacitors, for example, MOS capacitors, or MIM (metal-insulator-metal) capacitors. In the case of MIM capacitors, the distribution of the capacitor values is substantially the same on a wafer (varying from the center to the periphery) as in the case of ONO capacitors. The inventors have observed that in other components, the distribution may be different.

Thus, the present disclosure generally provides a method of manufacturing an electronic chip containing low-dispersion components comprising the steps of mapping the average dispersion of said components according to their position in test semiconductor wafers; associating correction elements with each component of each chip; and connecting by masking correction elements to each component according to said initial mapping.

It should also be understood that the present disclosure applies to other masking processes than those which have been described herein.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
   manufacturing electronic chips containing matching components, respectively, the manufacturing including:
   manufacturing auxiliary correction elements on the chips, respectively;
   for each chip, selectively activating by masking a connection of the auxiliary correction element of the chip to the matching component of the chip in accordance with a mapping of a statistical dispersion of corresponding test components of test semiconductor wafers according to positions of the corresponding test components on the test semiconductor wafers, the test components corresponding to the matching components.

2. The method of claim 1, wherein the matching components are main capacitors and the auxiliary correction elements are capacitors each sharing an electrode with the main capacitor belonging to the same chip.

3. The method of claim 2, wherein each of the main capacitors includes two doped polysilicon layers and a dielectric formed of a succession of silicon oxide, nitride, and oxide layers.

4. The method of claim 1, wherein the manufacturing includes step-and-repeat masking steps using reticles, one of the reticles being used to selectively connect the auxiliary correction components with the matching components, respectively, and wherein said step-and-repeat mask steps include shifting the one of the reticles by a variable step.

5. The method of claim 1, wherein, for each chip:
   the matching component is a main capacitor having first and second electrodes;
   the auxiliary correction element includes first and second correction capacitors each having first and second electrodes;
   the first electrodes of the first and second correction capacitors are contiguous with the first electrode of the main capacitor; and
   the second electrodes of the main capacitor and first and second correction capacitors are spaced apart from each other.

6. The method of claim 5, further comprising for each chip:
   forming a metallization adjacent to the main capacitor and the first and second correction capacitors;
   forming first and second terminals of the main capacitor, the first terminal being electrically coupled to the first electrode of the main capacitor and the second terminal being electrically coupled to the metallization;
   forming an insulating layer on the metallization;
   forming a conductive main pad and conductive first and second pads on the insulating layer; and
   forming a main conductive via extending through the insulating layer and electrically connecting the main pad to the metallization, wherein the selectively activating includes forming an auxiliary conductive via extending through the insulating layer and electrically connecting the metallization to one of the first and second pads, thereby connecting one of the first and second correction capacitors in parallel with the main capacitor between the first and second terminals.

7. The method of claim 5, further comprising for each chip:
   forming first, second, and third metallizations adjacent to the main capacitor and the first and second correction capacitors;
   forming first and second terminals of the main capacitor, the first terminal being electrically coupled to the first electrode of the main capacitor and the second terminal being electrically coupled to the first, second, and third metallizations;
   forming a conductive main pad electrically coupled to the first metallization layer;
   forming first and second conductive pads insulated from the second metallization, the first conductive pad being electrically coupled to the second electrode of the first correction capacitor and the second conductive pad being electrically insulated from the second electrode of the first correction capacitor; and
   forming third, fourth, fifth, and sixth conductive pads insulated from the third metallization, the third and fifth conductive pads being electrically coupled to the second electrode of the second correction capacitor and the fourth and sixth conductive pads being electrically insulated from the second electrode of the second correction capacitor, wherein the selectively activating includes electrically connecting one of the first and second conductive pads to the second metallization and electrically connecting one of the third, fourth, fifth, and sixth conductive pads to the third metallization, thereby connecting at least one of the first and second correction capacitors in parallel with the main capacitor between the first and second terminals.

8. The method of claim 7, wherein:
the first, second, and third metallization extend lengthwise parallel to each other in a first direction;
the third and fourth conductive pads are aligned with portions of the first conductive pad and portions of the main conductive pad in a second direction perpendicular to the first direction;
the fifth and sixth conductive pads are aligned with portions of the second conductive pad and portions of the main conductive pad in the second direction; and
the selectively activating includes electrically connecting the main conductive pad to the first metallization by a first connector, electrically connecting one of the first and second pads to the second metallization by a second connector, and electrically connecting one of the third, fourth, fifth, and sixth conductive pads to the third metallization by a third connector that is aligned with the first and second connectors in the second direction.

9. A method, comprising:
manufacturing first and second electronic chips of a semiconductor wafer, the first and second electronic chips containing first and second matching components, respectively, the manufacturing including:
manufacturing a first plurality of auxiliary correction elements on the first electronic chip and manufacturing a second plurality of auxiliary correction elements on the second electronic chip;
selectively activating by masking a first connection of a first auxiliary correction element of the first plurality of auxiliary correction elements to the first matching component of the first electronic chip in accordance with a mapping of a statistical dispersion of corresponding test components of test semiconductor wafers according to positions of the corresponding test components on the test semiconductor wafers, the test components corresponding to the matching components; and
selectively activating by masking a second connection of a second auxiliary correction element of the second plurality of auxiliary correction elements to the second matching component of the second electronic chip in accordance with the mapping of a statistical dispersion of corresponding test components of test semiconductor wafers.

10. The method of claim 9, wherein:
the first matching component and the first auxiliary correction elements are capacitors and share an electrode with each other; and
the second matching component and the second auxiliary correction elements are capacitors and share an electrode with each other.

11. The method of claim 10, wherein each of the first and second matching components includes two doped polysilicon layers and a dielectric formed of a succession of silicon oxide, nitride, and oxide layers.

12. The method of claim 9, wherein:
the manufacturing includes step-and-repeat masking steps using reticles, one of the reticles being configured to selectively connect the first auxiliary correction component with the first matching component and selectively connect the second auxiliary correction component with the second matching component, respectively, and
the step-and-repeat mask steps include shifting the one of the reticles by a variable step.

13. The method of claim 9, wherein:
the first matching component is a main capacitor having first and second electrodes;
the first auxiliary correction element includes first and second correction capacitors each having first and second electrodes;
the first electrodes of the first and second correction capacitors are contiguous with the first electrode of the main capacitor; and
the second electrodes of the main capacitor and first and second correction capacitors are spaced apart from each other.

14. The method of claim 13, further comprising:
forming a metallization adjacent to the main capacitor and the first and second correction capacitors;
forming first and second terminals of the main capacitor, the first terminal being electrically coupled to the first electrode of the main capacitor and the second terminal being electrically coupled to the metallization;
forming an insulating layer on the metallization;
forming a conductive main pad and conductive first and second pads on the insulating layer; and
forming a main conductive via extending through the insulating layer and electrically connecting the main pad to the metallization, wherein the selectively activating by masking the first connection includes forming an auxiliary conductive via extending through the insulating layer and electrically connecting the metallization to one of the first and second pads, thereby connecting one of the first and second correction capacitors in parallel with the main capacitor between the first and second terminals.

15. The method of 13, further comprising:
forming first, second, and third metallizations adjacent to the main capacitor and the first and second correction capacitors;
forming first and second terminals of the main capacitor, the first terminal being electrically coupled to the first electrode of the main capacitor and the second terminal being electrically coupled to the first, second, and third metallizations;
forming a conductive main pad electrically coupled to the first metallization layer;
forming first and second conductive pads insulated from the second metallization, the first conductive pad being electrically coupled to the second electrode of the first correction capacitor and the second conductive pad being electrically insulated from the second electrode of the first correction capacitor; and
forming third, fourth, fifth, and sixth conductive pads insulated from the third metallization, the third and fifth conductive pads being electrically coupled to the second electrode of the second correction capacitor and the fourth and sixth conductive pads being electrically insulated from the second electrode of the second correction capacitor, wherein the selectively activating by masking the first connection includes electrically connecting one of the first and second conductive pads to the second metallization and electrically connecting one of the third, fourth, fifth, and sixth conductive pads to the third metallization, thereby connecting at least one of the first and second correction capacitors in parallel with the main capacitor between the first and second terminals.

16. The method of claim 15, wherein:

the first, second, and third metallization extend lengthwise parallel to each other in a first direction;

the third and fourth conductive pads are aligned with portions of the first conductive pad and portions of the main conductive pad in a second direction perpendicular to the first direction;

the fifth and sixth conductive pads are aligned with portions of the second conductive pad and portions of the main conductive pad in the second direction; and the selectively activating by masking the first connection includes electrically connecting the main conductive pad to the first metallization by a first connector, electrically connecting one of the first and second pads to the second metallization by a second connector, and electrically connecting one of the third, fourth, fifth, and sixth conductive pads to the third metallization by a third connector that is aligned with the first and second connectors in the second direction.

\* \* \* \* \*